United States Patent [19]
Takahashi

[11] Patent Number: 5,909,448
[45] Date of Patent: Jun. 1, 1999

[54] MEMORY TESTING APPARATUS USING A FAILURE CELL ARRAY

[75] Inventor: Kouji Takahashi, Gyoda, Japan

[73] Assignee: Advantest Corporation, Tokyo, Japan

[21] Appl. No.: 08/836,764

[22] PCT Filed: Sep. 20, 1996

[86] PCT No.: PCT/JP96/02731

§ 371 Date: May 21, 1997

§ 102(e) Date: May 21, 1997

[87] PCT Pub. No.: WO97/11381

PCT Pub. Date: Mar. 27, 1997

[30] Foreign Application Priority Data

Sep. 22, 1995 [JP] Japan .................................. 7-269393
Aug. 27, 1996 [JP] Japan .................................. 8-225232

[51] Int. Cl.⁶ .............................. G11C 29/00; G11C 7/00
[52] U.S. Cl. ........................................ 371/21.2; 365/201
[58] Field of Search ............................. 371/21.2, 10.3, 371/21.1, 21.6, 21.5; 365/201

[56] References Cited

U.S. PATENT DOCUMENTS

| | | | |
|---|---|---|---|
| 4,782,486 | 11/1988 | Lipton et al. | 371/21.5 |
| 5,155,844 | 10/1992 | Cheng et al. | 371/21.6 |
| 5,280,486 | 1/1994 | Arkin et al. | 371/21.6 |
| 5,363,382 | 11/1994 | Tsukakoshi | 371/21.2 |
| 5,408,628 | 4/1995 | Ameti | 371/21.6 |
| 5,410,687 | 4/1995 | Fujisaki et al. | 371/10.3 |
| 5,539,699 | 7/1996 | Sato et al. | 365/201 |
| 5,541,938 | 7/1996 | Di Zenzo et al. | 371/21.6 |
| 5,717,694 | 2/1998 | Ohsawa | 371/21.2 |
| 5,720,031 | 2/1998 | Lindsay | 395/183.18 |
| 5,841,785 | 11/1998 | Suzuki | 371/21.1 |
| 5,862,088 | 1/1999 | Takemoto et al. | 365/201 |

FOREIGN PATENT DOCUMENTS

| | | |
|---|---|---|
| 61-280100 | 12/1986 | Japan . |
| 6-119799 | 4/1994 | Japan . |
| 8-36900 | 2/1996 | Japan . |
| 8-63998 | 3/1996 | Japan . |

*Primary Examiner*—Hoa T. Nguyen
*Attorney, Agent, or Firm*—Staas & Halsey

[57] ABSTRACT

A memory testing apparatus is provided which can determine at high speed whether to relieve a failure of an IC memory or not. In case an IC memory is tested by the memory testing apparatus and a decision as to whether to relieve a failure of the IC memory or not is rendered, a failure cell 1 is provided for receiving a failure signal from a logical comparator 14 and an address signal from a pattern generator 23, said address signal being used for taking a failure signal in the failure cell. The failure cell 1 stores therein only failure addresses of the IC memory and is constructed by an address hold register 3, an address comparator 5, and a controller 8. A failure cell array 2 comprising a plurality of these failure cells connected in cascade is used to limit data for creating a failure map to only failure occurrence addresses and to store the data therein. Thus, the time for reading out the data stored in the failure cell array 2 to an arithmetic part 15 is reduced.

8 Claims, 10 Drawing Sheets

FAILURE MAP

MEMORY TESTING APPARATUS USING A FAILURE CELL ARRAY

FIELD OF THE INVENTION

The present invention relates to a memory testing apparatus for testing a memory in the form of an integrated circuit (a semiconductor integrated circuit memory, hereinafter referred to as an IC memory), and particularly, relates to a portion or section of such memory testing apparatus including a failure analysis memory for storing test results of an IC memory.

BACKGROUND OF THE RELATED ART

Storage capacity of an IC memory is increasing more and more, and accordingly an increased IC chip area and formation of patterns at high density are required. As a result, there is an increased possibility that a lowering of the yield of IC memories caused by a very minute defect occurs. In order to prevent the yield of IC memories from being lowered, various failure relieving procedures or processes have been taken wherein a failure or defect element is replaced by a substitute or alternative element.

FIG. 12 generally shows an entire circuit arrangement of a prior conventional memory testing apparatus, and FIG. 13 is an illustration of the inside of an IC memory for explaining an analysis method for failure relief. As shown in FIG. 13, an IC memory includes a main element 17 which is a main storage portion, and four substitute elements 18, 19, 20 and 21 disposed around the main element 17 (in this example, at the lower side and the right side of the main element). The main element 17 has, in this example, the total of 64 storage elements in the form of a matrix of 8 rows×8 columns. As shown in the figure, rows are denoted by A, B, C, . . . , H, respectively, and columns are denoted by a, b, c, . . . , h, respectively, for brief explanation. Each of intersecting points or areas Aa, Ab, Ac, . . . , Hh of rows and columns of the main element 17 forms a unit element which is a unit storage element of the IC memory.

The substitute elements 18, 19, 20 and 21 are previously provided in the IC chip for a failure relief and each substitute element comprises a plurality of unit storage elements. In this example, four substitute elements are shown. However, the number of substitute elements and the disposed locations in the IC chip may be arbitrarily selected as the case may be.

Assuming that the IC memory shown in FIG. 13 was tested by a memory testing apparatus shown in FIG. 14 to be described later, and as a result, failures or defects were found in, for example, four unit elements Bb, Be, Df and Fe as shown in FIG. 13 by oblique lines, the row B including the failure unit elements Bb and Be, the column f including the failure unit element Df, and the row F including the failure unit element Fe are removed from the main element 17 so that no failure unit element exists in the main element 17.

Then, the substitute element 18 is substituted for the row B, the substitute element 19 is substituted for the row F, and the substitute element 20 is substituted for the column f. In such a way, by replacing a row or rows and/or a column or columns each including one or more failure unit elements by such substitute elements, the IC memory can be relieved such that all of the addresses thereof can be used even if the IC memory has one or more failure unit elements in the main element 17 thereof.

As described above, in order to relieve an IC memory of a failure element or elements, "information for indicating at which address or addresses a failure unit element or elements exist" which is called a failure map is necessary, and hence, as shown in FIG. 12, a memory testing apparatus having a failure analysis memory (failure memory) 16 for storing therein failure information (data) is used.

This memory testing apparatus comprises a timing generator (TMG GEN) 22, a pattern generator (PTN GEN) 23 and a waveform shaping device (WAVE SHAPE) 24 whereby a predetermined test pattern signal is generated and is applied to a memory under test (IC memory under test) MUT to write predetermined data in the memory under test MUT (hereinafter referred to as MUT). The data written in the MUT are read out therefrom later to supply to a logical comparator (LG COMPA) 14 as a response output signal.

The pattern generator 23 supplies a test pattern signal to an MUT via the waveform shaping device 24 and also supplies an expected value pattern signal (EXP SIG) directly to the logical comparator 14. Further, the pattern generator 23 supplies an address signal (ADR SIG) to the failure analysis memory (FAIL MEM) 16, the address signal specifying the same address as that of an address signal added to both the test pattern signal and the expected value pattern signal.

The logical comparator 14 compares a response output signal read out from an MUT with an expected value pattern signal outputted from the pattern generator 23 and detects as to whether there is an anti-coincidence or mismatch between both signals. That is, when the response output signal does not coincide with the expected value pattern signal, the logical comparator 14 writes in the failure analysis memory 16 a failure signal or data (FAIL SIG) indicating a location of a failure cell (unit element) in the main element 17 of the MUT. The address of the failure analysis memory 16 into which the failure data is written is the same address as the MUT address at which the anti-coincidence has occurred, and the address signal specifying that MUT address is supplied directly to the failure analysis memory 16 from the pattern generator 23, as mentioned above.

The failure analysis memory 16 is provided with a memory having at least the same storage capacity as that of the MUT and the memory is initialized before starting a test. For example, the memory of the failure analysis memory 16 is initialized by writing logical "0s" in all of the addresses thereof. When a failure signal is generated from the logical comparator 14 during a test of an MUT, a mark is written in an address in the memory of the failure analysis memory 16 specified by the above address signal. That is, for example, a logical "1" is written in that address.

In such a way, failure address information of an MUT specifying the addresses of the MUT associated with the failures which occurred during a series of tests is stored in the failure analysis memory 16. The failure data stored in the failure analysis memory 16 are read out therefrom after all of the tests for an MUT are completed. When such failure data are utilized for relieving an MUT of its failure memory element for instance, a failure map is created, which is read out into an arithmetic and logic (hereinafter referred to as arithmetic) or computing part (ALU) 15 to determine a row or rows and/or a column or columns to be relieved.

On the other hand, in a usually utilized testing method such as a marching method or a galloping method or the like, since a plurality of reading tests are performed on the same address of an MUT in a series of tests, a plurality of failure signals may be generated with respect to the same address signal. However, regarding the failure of the same address, a plurality of marks are repeatedly written in the same address one over another so that only information required for the failure relief can be stored.

As described above, the failure analysis memory 16 has at least the same storage capacity as that of an MUT. Whenever a failure signal is generated, a logical "1" is written in the same address location of the failure analysis memory 16 as that of the unit element which has generated the failure signal. Therefore, the failure analysis memory 16 must have at least the same storage capacity as that of an MUT as well as operate at the same operating rate or speed as that of the MUT. For that reason, a conventional failure analysis memory has been constructed by using memory elements called static RAM (SRAM) which can operate at high operating rate. However, since an SRAM is expensive and in addition, an SRAM having large storage capacity cannot be produced, there is a problem that a failure analysis memory having a large storage capacity must be constituted by using a large number of SRAMs.

Consequently, an attempt for using a dynamic RAM (DRAM) which operates at low operating rate or speed, but is inexpensive has been made to construct a failure analysis memory. FIG. 14 shows a circuit construction of a failure analysis memory contemplated in case a DRAM is used.

A method can be contemplated wherein a switching circuit MP and a plurality of memory banks BK#1, BK#2, BK#3, ..., BK#N are provided in a failure analysis memory 16, and each time a failure signal (failure data) is generated, the switching circuit MP switches the memory banks BK#1–BK#N from one memory bank to next succeeding memory bank to supply the failure signal to the one memory bank thereby distributing the failure data into the plurality of memory banks BK#1, BK#2, BK#3, ..., BK#N in regular sequence to store therein. This method is generally called an interleave method. By employing this interleave structure, the memory banks BK#1–BK#N can be used each of which operates at an operating rate or speed which is 1/N of that of an MUT.

In case the interleave structure shown in FIG. 14 is employed, an address signal having an address at which a failure signal is generated and the failure signal are randomly supplied to each of the memory banks BK#1–BK#N, and therefore, each of the memory banks BK#1–BK#N requires the same memory capacity as that of an MUT. As a result, when an interleave structure of N phases is arranged, each memory bank must have the memory capacity of N times larger than that of an MUT. Accordingly, there is a shortcoming that the amount of usage of memory elements is increased in proportion to the number of phases N of interleave structure.

In addition, when a failure map which is the information necessary for a relief operation is read out of the failure analysis memory 16 to the computing part 15, in order to obtain the information required to determine whether a relief is necessary or not, the data the number of which is equal to that of all of unit elements constituting an MUT must be read out of the failure analysis memory 16. A long time is necessary for this operation. Consequently, there is a disadvantage that it takes a long time to determine whether a relief is necessary or not, resulting in worse in operation or work efficiency.

SUMMARY OF THE INVENTION

It is a first object of the present invention to provide a memory testing apparatus which can reduce the amount of information read out of a failure analysis memory to an arithmetic part for a failure relief, thereby to be able to significantly reduce the time duration required to determine whether a relief is necessary or not.

It is a second object of the present invention to provide a memory testing apparatus which can reduce the memory capacity of each memory bank in case a failure analysis memory is constructed using an interleave structure.

It is a third object of the present invention to provide a memory testing apparatus which can prevent, when failure signals are generated from the same address in the close test cycles, the second failure signal and the failure signal or signals subsequent thereto generated from the same address from being written in a failure analysis memory, whereby the writing frequency of failure signals into the failure analysis memory can be reduced and hence each memory bank is not necessary to operate at a high operating rate.

According to a first aspect of the present invention, a memory testing apparatus is provided, wherein the amount of information read out to the arithmetic part for the relief of a failure is reduced and the time for determining whether a relief is necessary or not is significantly reduced by using a failure cell array comprising a plurality of failure cells connected in cascade for storing addresses of only failure unit elements as a result of tests, instead of a conventional failure analysis memory for storing the test result, i.e., presence or absence of a failure, for each of all of the unit elements constituting an MUT.

According to a second aspect of the present invention, there is provided a memory testing apparatus arranged such that when a failure analysis memory is constructed in the form of an interleave structure, a switching circuit for distributing failure data into memory banks is controlled to be switched depending upon an address at which a failure has occurred.

That is, the switching circuit is controlled to be switched in accordance with a value of the least significant bit or bits of the address at which a failure has occurred and hence the failure occurrence addresses to be stored in the respective memory banks are classified in accordance with the value of the least significant bit or bits of the address.

Therefore, by employing the arrangement according to the second aspect of the present invention, assuming that, for example, the switching circuit is controlled in accordance with a value of the least significant two bits of the address at which a failure has occurred, the total addresses to be written in respective memory banks are classified ¼ by ¼ and distributed into each memory bank by ¼ of the total addresses. Therefore, the storage capacity of each memory bank can be limited to ¼ of that of an MUT.

According to a third aspect of the present invention, a problem caused by use of the construction according to the second aspect can also be eliminated.

That is, when a switching operation of the switching circuit is controlled in accordance with a value of the least significant bit or bits as described above, if the same address is accessed in close test cycles and a failure occurs at the same address in each test cycle, the failure data must be written continuously in the same memory bank.

Such situation occurs when a test by an inter-cell interference test pattern is performed. The inter-cell interference test pattern includes, for example, a galloping pattern, a ping-pong pattern, a butterfly pattern, etc., and is a test pattern for alternately performing, for instance, a reading operation out of and a writing operation in a memory cell of interest and memory cells which are considered to interfere with the interested memory cell as a center thereof and checking whether the content of the interested memory cell is broken or not.

When a test by the inter-cell interference test pattern is performed, if a memory cell of interest is a failure cell, a failure occurs at the same address in each of the close test cycles. Therefore, in case a memory bank for storing failure data is specified in correspondence with a value of the least significant bit or bits of an address at which a failure has occurred, if failures continuously occur at the same address, a situation would occur where failure data have to be continuously written in the same memory bank. As a result, that memory bank would be required to operate at a high operating rate.

In order to eliminate this problem, according to the third aspect of the present invention, there is provided means for inhibiting, when failures occur at the same address in close test cycles, failure data of the second occurrence and of the subsequent occurrence or occurrences generated at the same address from being written. By this means for inhibiting, the writing frequency of failure data in a memory bank can be reduced, and thus a memory bank is not required to operate at a high operating rate.

Therefore, according to the second and the third aspects of the present invention, there are obtained an advantage that a failure analysis memory can be constructed by reduced numbers of memory elements each of which is required to operate at a high operating rate, and an advantage that a low cost memory element can be used.

DESCRIPTION OF THE PREFERRED EMBODIMENTS

Figure 1:
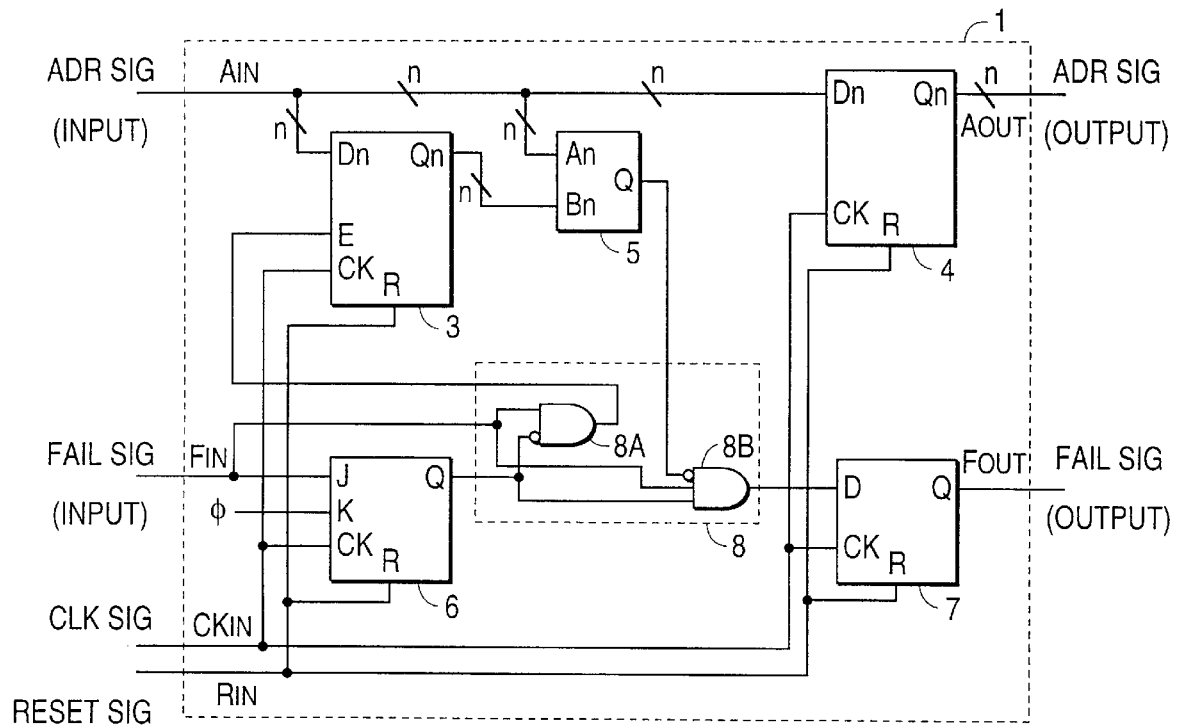
FIG. 1 is a block diagram showing a specific example of a failure cell used in a memory testing apparatus according to the present invention.

First, a first embodiment of the memory testing apparatus according to the present invention will be explained with reference to FIG. 3. Further, in order to simplify the explanation, portions or elements in FIG. 3 corresponding to those in FIG. 12 have the same reference characters affixed thereto as those in FIG. 12 and the explanation thereof will be omitted unless it is necessary.

Figure 3:
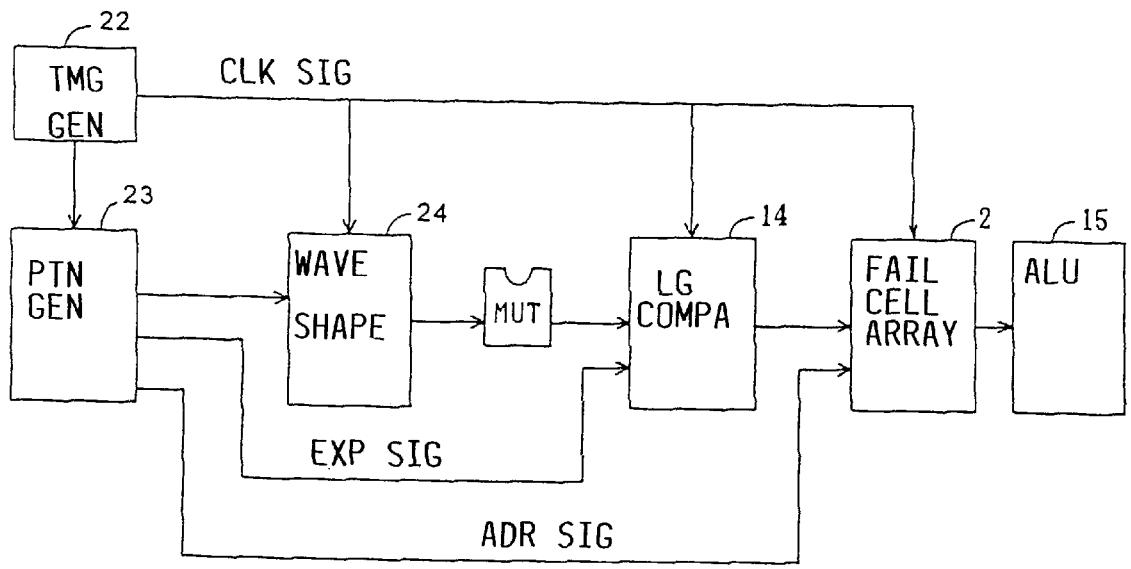
FIG. 3 is a block diagram generally showing an entire construction of a first embodiment of the memory testing apparatus according to the present invention.
Figure 12:
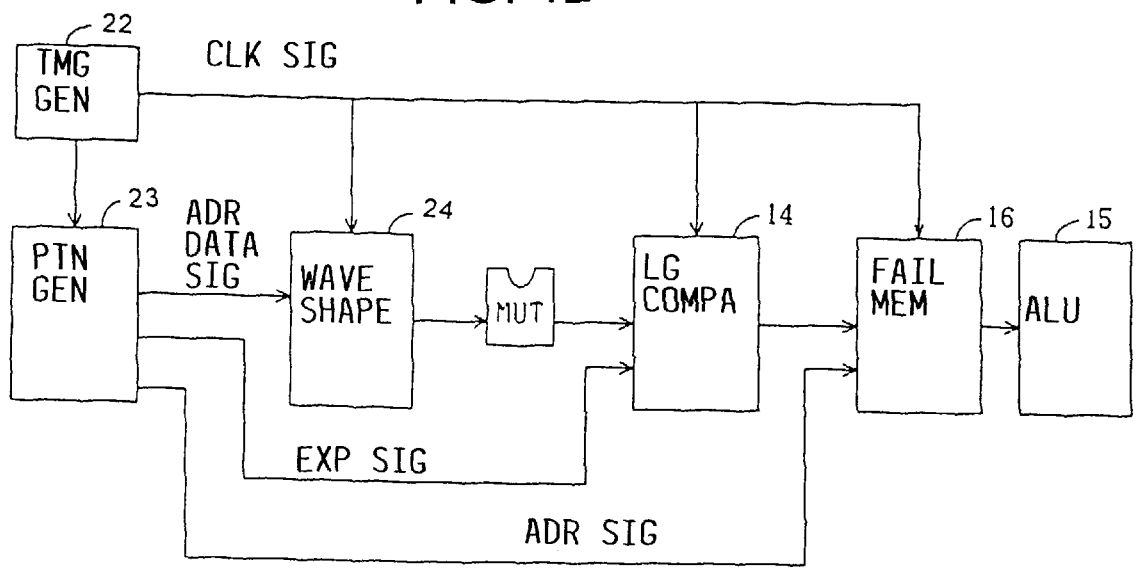
FIG. 12 is a block diagram generally showing an entire construction of an example of a conventional memory testing apparatus.

The memory testing apparatus shown in FIG. 3 is a memory testing apparatus where a failure cell array (FAIL CELL ARRAY) 2 is used instead of the failure analysis memory 16 in the conventional memory testing apparatus shown in FIG. 12. The memory testing apparatus shown in FIG. 3 is the same as the conventional memory testing apparatus except this point. The failure cell array 2 receives, similarly to the failure analysis memory 16, a failure signal (FAIL SIG) outputted from the logical comparator (LG COMPA) 14, an address signal (ADR SIG) supplied from the pattern generator (PTN GEN) 23 for acquiring the failure signal, a clock signal (CLK SIG) supplied from the timing generator (TMG GEN) 2 and a reset signal (not shown) from a system bus. The failure cell array 2 which has received those signals stores information for creating a failure map as will be explained below, and outputs the information to the arithmetic or computing part (ALU) 15 as information needed for determining whether a relief is necessary or not.

Figure 2:
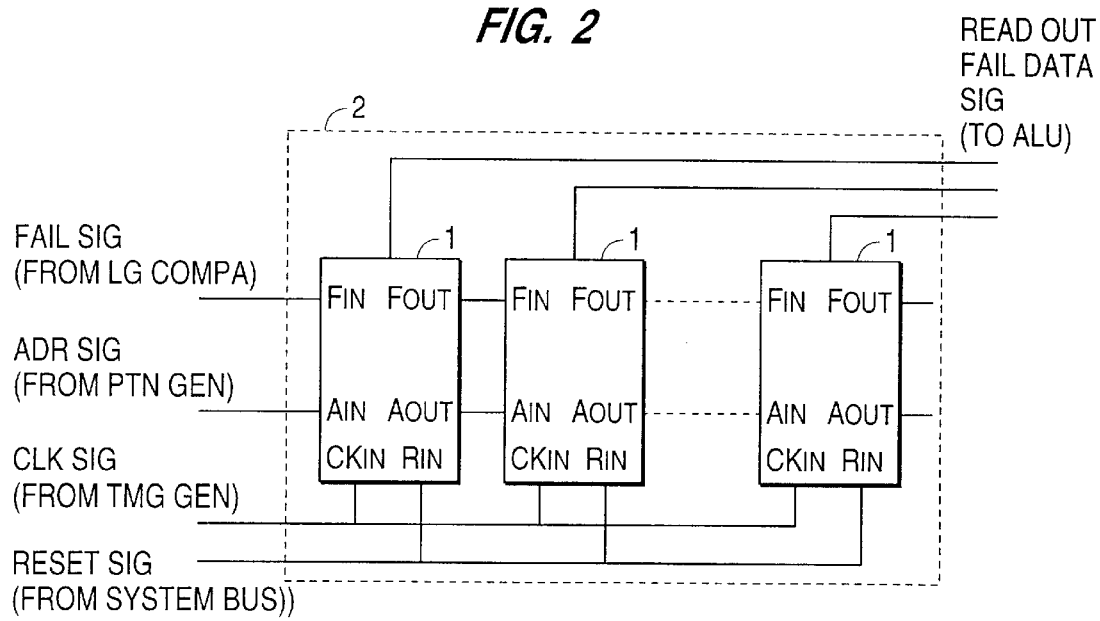
FIG. 2 is a block diagram showing a specific example of a failure cell array used in a memory testing apparatus according to the present invention.

Next, a specific example of the failure cell array 2 will be explained in detail with reference to FIG. 2.

The failure cell array 2 is constituted by a plurality of failure cells 1 and each failure cell 1 has a terminal AIN for receiving from the pattern generator an address signal for acquiring a failure signal, a terminal AOUT for sending out the address signal, a terminal FIN for receiving the failure signal, a terminal FOUT for sending out the failure signal, a terminal CKIN for receiving a clock signal and a terminal RIN for receiving a reset signal.

The first failure cell 1 depicted at the leftmost position in the figure among the plurality of failure cells 1 receives at the terminal AIN an address signal from the pattern generator 23 and receives at the terminal FIN a failure signal from the logical comparator 14.

The second failure cell 1 receives at the terminal AIN an output signal from the terminal AOUT of the first failure cell 1 and receives at the terminal FIN an output signal from the terminal FOUT of the first failure cell 1.

Similarly, each failure cell 1 among the third failure cell, the fourth failure cell, . . . , receives at its terminals AIN and FIN output signals from the terminals AOUT and FOUT of the failure cell 1 of the previous stage, respectively. Also, the terminals CKIN and the terminals RIN of all the failure cells 1 are connected in parallel, respectively.

In such a way, the plurality of failure cells 1 constructing the failure cell array 2 are connected in cascade such that the terminals AIN and AOUT are interconnected and the terminals FIN and FOUT are interconnected to construct the failure cell array 2 which sequentially transfers an address signal for acquiring a failure signal and a failure signal. Further, each of all the failure cells 1 receives at the terminal RIN a reset signal at the test starting time and the status is initialized to initial status where any failure information is not held in the failure cell 1.

During a test, when the first failure element is detected in an MUT, an address signal from the pattern generator 23 and a failure signal from the logical comparator 14 are supplied to the terminals AIN and FIN of the first failure cell 1 respectively. At this time, the first failure cell 1 is in the initial status in which any failure information is not held therein. Therefore, when the address signal and the failure signal are supplied to the first failure cell 1, the failure information is just held therein and only the status is changed to holding status in which failure information is held therein. Thus failure information is not sent to the terminal FOUT.

At a later time during the test, when the second failure element is detected in the MUT and an address signal and a failure signal are supplied to the first failure cell 1, since the first failure cell 1 is already in holding status in which failure information is held therein, the address signal currently being received at the terminal AIN is compared with the address of the failure information held in the first failure cell 1. When both addresses are identical, a failure signal is not sent to the terminal FOUT. When both addresses are not identical, a failure signal is sent to the terminal FOUT and an address signal is sent to the terminal AOUT.

Accordingly, when the first failure cell 1 does not send out a failure signal to the terminal FOUT thereof, there is no status change in the second failure cell 1 and the subsequent failure cells 1. However, when the first failure cell 1 sends out a failure signal to the terminal FOUT thereof, the second failure cell 1 receives an address signal and a failure signal at the terminals AIN and FIN thereof, respectively.

When the second failure signal is supplied from the first failure cell 1 to the second failure cell 1, like the case in which the first failure signal is supplied to the first failure cell 1, the second failure cell 1 holds the failure information therein and changes its status to a holding status since the second failure cell 1 is in the initial status. Consequently, a failure signal is not sent out to the terminal FOUT of the second failure cell 1.

After that, when the third failure element is detected in the MUT, each of the first and the second failure cells 1 compares the address of the failure information held therein with the address signal currently being received at the terminal AIN thereof. When both addresses are identical, a failure signal is not sent to the terminal FOUT. However, when both addresses are not identical, a failure signal is sent to the terminal FOUT and an address signal is sent to the terminal AOUT.

In such a way, each time a failure element is detected in an MUT, each failure cell 1 determines as to whether or not a failure signal should be sent to the terminal FOUT. An address signal which is different from an address of failure information held in any of the failure cells 1 is transferred together with a failure signal in regular sequence to the failure cells 1 at the subsequent stages. The address signal is held in a failure cell 1 which is in the initial status among the subsequent failure cells, and is stored in the failure cell array 2 as information for creating a failure map of the MUT to be read out to the computing part 15 for determining whether to relieve or not.

Next, a specific example of a failure cell 1 will be described in detail with reference to FIG. 1.

A failure cell 1 comprises an address hold register 3, an address transfer register 4, an address comparator 5, a status hold register 6, a status transfer register 7, and a controller 8.

The address hold register 3 is constructed by an n bit synchronous type latch of D type. The address hold register 3 acquires, in synchronization with a clock signal received at the terminal CKIN of the failure cell 1, an address signal for taking a failure signal in the failure cell received at the terminal AIN of the failure cell 1 when a latch enable signal from the controller 8 is logical 1. Then the address signal is sent to the address comparator 5.

The address transfer register 4 is made up of an n bit D type flip flop (referred to as FF hereinafter). The address transfer register 4 acquires, in synchronization with a clock signal received at the terminal CKIN of the failure cell 1, an address signal for failure signal acquisition received at the terminal AIN of the failure cell 1 and sends it out to the terminal AOUT of the failure cell 1 as an address signal for taking a failure in for the next stage.

The address comparator 5 is made up of an n bit digital comparator. The address comparator 5 receives an address signal for failure signal acquisition received at the terminal AIN of the failure cell 1 and an output signal of the address hold register 3 and sends a signal of logical 1 to the controller 8 when each corresponding bit matches each other between the both signals.

The status hold register 6 is made up of a JK type FF. The status hold register 6 receives at J terminal a failure signal received at the terminal FIN of the failure cell 1 and receives at CK terminal a clock signal received at the terminal CKIN of the failure cell 1. K terminal of the status hold register 6 is always fixed to a logical 0. The status hold register 6 sends a status signal of the failure cell 1 to the controller 8.

The status transfer register 7 is made up of a D type FF. The status transfer register 7 receives at D terminal a failure signal for the next stage from the controller 8 and receives at CK terminal a clock signal received at the terminal CKIN of the failure cell 1, and further, sends a failure signal for the next stage to the terminal FOUT of the failure cell 1.

The controller 8 includes an AND gate 8 and receives a failure signal received at the terminal FIN of the failure cell 1 and a status signal from the status hold register 6. Then the controller 8 sends a latch enable signal to the address hold register 3 and sends a failure signal for the next stage to the status transfer register 7. A reset signal received at the terminal RIN of the failure cell 1 is sent to respective R terminals of the address hold register 3, the address transfer register 4, the status hold register 6 and the status transfer register 7.

The failure cell 1 arranged as described above operates as follows.

1. The address hold register 3, the address transfer register 4, the status hold register 6 and the status transfer register 7 are initialized to initial status of logical 0 . The address transfer register 4 sends, in synchronization with a clock signal, an address signal for taking a failure in to the terminal AOUT as an address signal for taking a failure in for the next stage.

2. Upon receipt of a failure signal when the status hold register 6 is in initial status of logical 0 , the status hold register 6 is changed to holding status of logical 1 in synchronization with a clock signal. At the same time, an AND gate 8A outputs a logical 1 and the address hold register 3 is enabled. Then, an address signal for taking a failure in is taken in the address hold register 3 in synchronization with a clock signal. On the other hand, since the AND gate 8B receives a logical 0 signal from the status hold register 6, the AND gate 8B outputs a logical 0 . Since the D terminal of the status transfer register 7 to which the output of the AND gate 8B is applied is logical 0 , the status transfer register 7 remains logical 0 even if it receives a clock signal at the CK terminal. Thus, a failure signal for the next stage is not sent out to the terminal FOUT of the failure cell 1.

3. Upon receipt of a failure signal when the status hold register 6 is in holding status of logical 1, the AND gate 8A in the controller 8 outputs logical 0, and thus the address hold register 3 is not enabled and remains unchanged even if it receives a clock signal at the CK terminal. On the other hand, the AND gate 8B receives an output signal of the address comparator 5. When an address signal is different from an output signal of the address hold register 3 and an output signal of the address comparator 5 is logical 0, the AND gate 8B outputs a logical 1. Then, the status transfer register 7 which receives the output of the AND gate 8B becomes logical 1 in synchronization with a clock signal received at the CK terminal and outputs a failure signal for the next subsequent stage to the terminal FOUT of the failure cell 1. However, when an address signal is same as an output signal of the address hold register 3 and an output signal of the address comparator 5 is logical 1, the AND gate 8B outputs a logical 0. Then, the status transfer register 7 which receives the output of the AND gate 8B remains logical 0 even if it receives a clock signal at the CK terminal. Thus, the status transfer register 7 does not send out a failure signal for the subsequent stage to the terminal FOUT of the failure cell 1.

That is, the status of the failure cell 1 is initialized to the initial status by a reset signal. Upon receipt of a failure signal when the failure cell 1 is in the initial status, the failure cell 1 holds an address signal for taking a failure therein in the internal address hold register 3 and the status of the failure cell 1 is changed to holding status. Upon receipt of a failure signal when the failure cell 1 is in holding status, an address signal for taking a failure in is compared with the held address. When the both addresses are different from each other, a failure signal for the next subsequent stage is sent out. When the both addresses are identical, a failure signal for the next subsequent stage is not sent out.

In the foregoing, there is described assuming that a data which is valid for allover the bit width of the address signal in the failure cell 1 is transmitted. However, in the invention of claim 3, when an MUT having the address signal the bit width of which is smaller than that of the address signal in the failure cell 1 is tested, the circuit is arranged such that address signals corresponding to the excess bit width portion of the address signal in the failure cell 1 are inhibited, e.g., fixed to logical 0. By this arrangement, an MUT having the address signal the bit width of which is different from that of the address signal in the failure cell 1 can also be tested.

Next, a specific example of a failure analysis memory used in the second embodiment of the memory testing apparatus according to the present invention will be described in detail with reference to FIG. 4.

Figure 4:
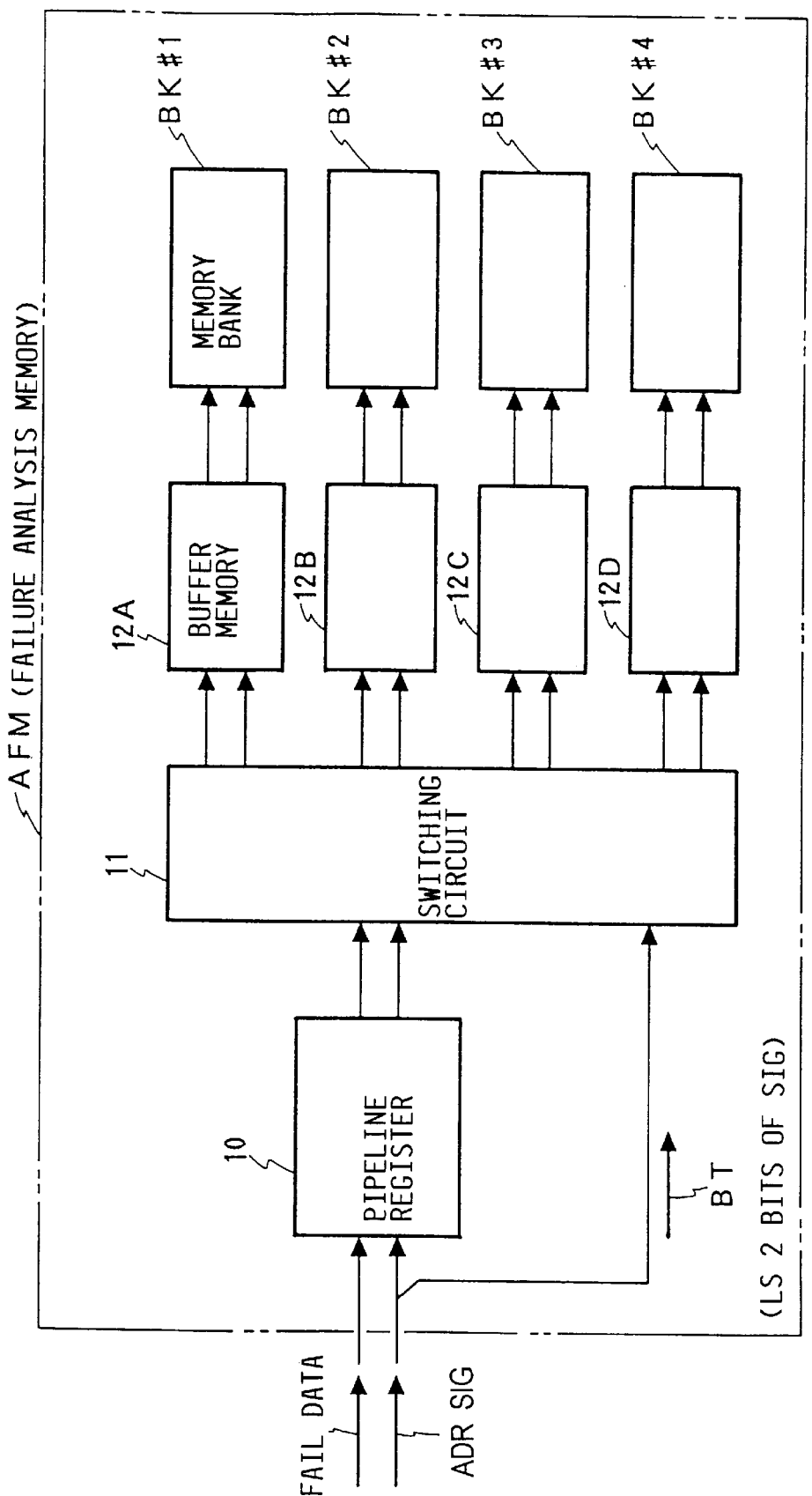
FIG. 4 is a block diagram showing an entire construction of a specific example of a failure analysis memory used in a second embodiment of the memory testing apparatus according to the present invention.

In FIG. 4, AFM shows in generalized manner a failure analysis memory used in the second embodiment of the memory testing apparatus according to the present invention. This failure analysis memory AFM comprises a pipeline register 10, a switching circuit 11, buffer memories 12A–12D, and memory banks BK#1–BK#4 for storing failure data (failure signals) outputted from those buffer memories 12A–12D in addresses thereof at which failure data have occurred.

The failure analysis memory AFM according to the present invention is arranged such that the switching position of the switching circuit 11 is controlled by a value of a signal BT of, for example, the least significant two bits of an address signal in which a failure has occurred.

When a value of the least significant two-bit signal BT of a failure occurrence address is, for example, "0,0", the switching circuit 11 supplies a failure data and an address signal indicating the failure occurrence address to the buffer memory 12A. The memory bank BK#1 is accessed by the address signal and the failure data is written in the memory bank BK#1.

When the least significant two-bit signal BT of a failure occurrence address is "0,1", the switching circuit 11 supplies a failure data and an address signal indicating the failure occurrence address to the buffer memory 12B. Therefore, in this case, a failure data and an address signal are supplied to the memory bank BK#2 via the buffer memory 12B and the failure data is stored in an address specified by the address signal.

When the least significant two-bit signal BT of a failure occurrence address is "1,0", the switching circuit 11 supplies a failure data and an address signal indicating the failure occurrence address to the buffer memory 12C and the failure data is stored in an address in the memory bank BK#3 specified by the address signal.

When the least significant of a failure occurrence address two-bit signal BT is "1,1", the switching circuit 11 supplies a failure data and an address signal indicating the failure occurrence address to the buffer memory 12D and the failure data is stored in an address in the memory bank BK#4 specified by the address signal.

In such a way, by performing a switching operation of the switching circuit 11 in accordance with a value of the least significant two-bit signal BT, in the memory bank BK#1, a failure data is written in an address of a failure occurrence address when a value of the least significant two-bit signal BT is "0,0", and any failure data generated in an address having the other values is not written. Therefore, when the least significant two-bit values of respective address signals are the same, the failure data associated with those address signals are written in the corresponding one of the memory banks BK#1–BK#4. Consequently, the storage capacity of each of the memory banks BK#1–BK#4 may be ¼ of that of the MUT.

Further, in the present invention, when failures occur at the same address within a short interval, writing of failure data of the second time and the subsequent times thereafter generated at the same address is inhibited by the pipeline register 10.

Figure 5:
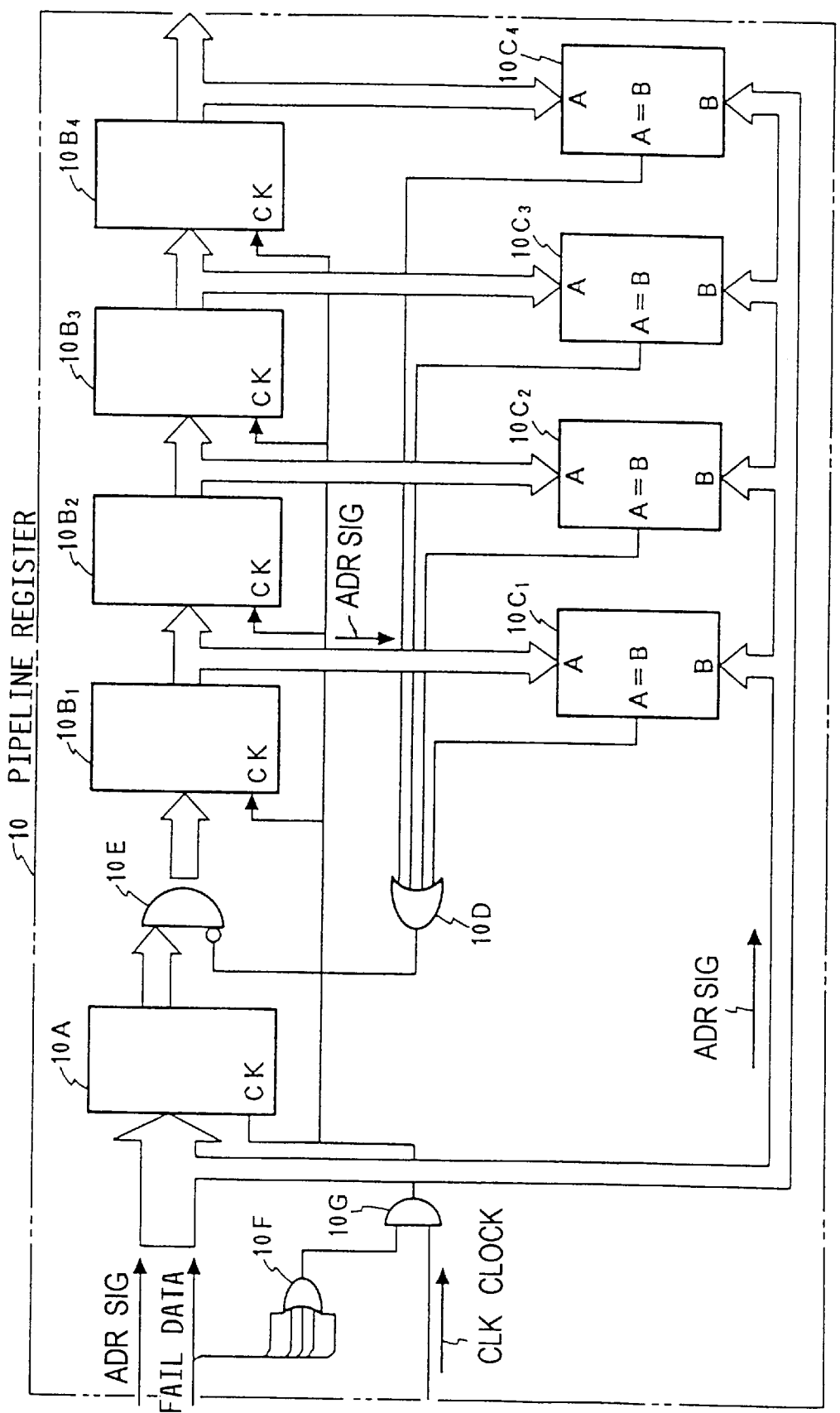
FIG. 5 is a block diagram showing a specific example of a pipeline register of a failure analysis memory used in the memory testing apparatus according to the present invention.

FIG. 5 shows an example of a circuit configuration of the pipeline register 10 for this purpose. In the example shown in FIG. 5, a four-stage pipeline structure is constructed by registers 10B1–10B4. Addresses and failure data of the first failure occurrence through the fourth failure occurrence are stored in the registers 10B4–10B1 respectively in order of 10B4, 10B3, 10B2 and 10B1. An address signal indicating an address at which a new failure has occurred and a failure data are stored in the first stage register 10A. A clock CLK is supplied, in synchronization with a test cycle end, to each clock input terminal CK of the registers 10A and 10B1–10B4. Therefore, address signals and failure data stored respectively in the registers 10B1–10B4 are shifted to the subsequent stages one stage by one stage, in synchronization with a clock CLK.

Further, a clock CLK is taken out such that when a logical 1 (presence of a failure) is included in any one of bits in failure data, the logical 1 signal is taken out via an OR gate 10F, and then a gate 10G is controlled by the logical 1 signal to open status. Thus, a clock CLK is taken out via the gate 10G. Therefore, a clock CLK passes through the gate 10G in only test cycle in which a failure occurs and is supplied to the register 10A and to the pipeline.

An address signal is taken out from each output side of the registers 10B1–10B4 composing a pipeline and is inputted to one input terminal A of a corresponding one of address comparators 10C1–10C4. An address signal stored in the first stage register 10A is supplied to the other input terminal B of each of the address comparators 10C1–10C4. Therefore, an address of new failure occurrence is compared with each of four addresses of failures occurred in the past in the address comparators 10C1–10C4.

Comparison outputs of the respective address comparators 10C1–10C4 are supplied to a gate 10E via an OR gate 10D. Each of the address comparators 10C1–10C4 outputs a logical "1" when an address signal inputted to an input terminal A matches an address signal inputted to an input terminal B. By supplying this logical "1" to the gate 10E via the OR gate 10D, when any one of the address comparators 10C1–10C4 detects an address match, the gate 10E is controlled to closed status. As a result, when an address of a new failure occurrence coincides with any one of past four addresses, the new address is not taken in the pipeline. Thus, when a next failure occurs, the new address is substituted by the next failure address signal in the register 10A and disappears. Further, in FIG. 5, a four-stage pipeline structure is described. However, the number of pipeline stages is not limited to four stages and can arbitrary be selected.

Address signals and failure data outputted from the pipeline register 10 are classified by the switching circuit 11 in accordance with a value of the least significant two-bit signal BT and are distributed to the buffer memories 12A–12D, and then are written in the memory banks BK#1–BK#4.

Here, the number of stages required for a first-in first-out memory which constitutes the buffer memories 12A–12D will be examined. When a failure map shown in FIG. 6 (equivalent to a unit element arrangement in an MUT) is created, columns of addresses A0 and A4 are written in the memory bank BK#1. Columns of addresses A1 and A5 are written in the memory bank BK#2. Columns of addresses A2 and A6 are written in the memory bank BK#3. Columns of addresses A3 and A7 are written in the memory bank BK#4.

Figure 7:
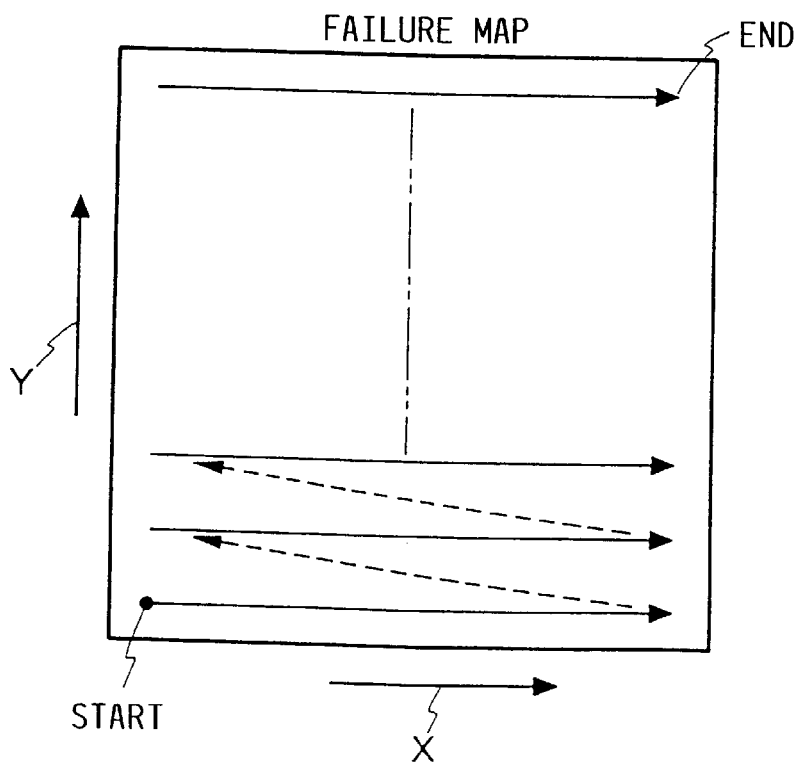
FIG. 7 is a diagram for explaining the operation of the second embodiment of the memory testing apparatus according to the present invention.
Figure 8:
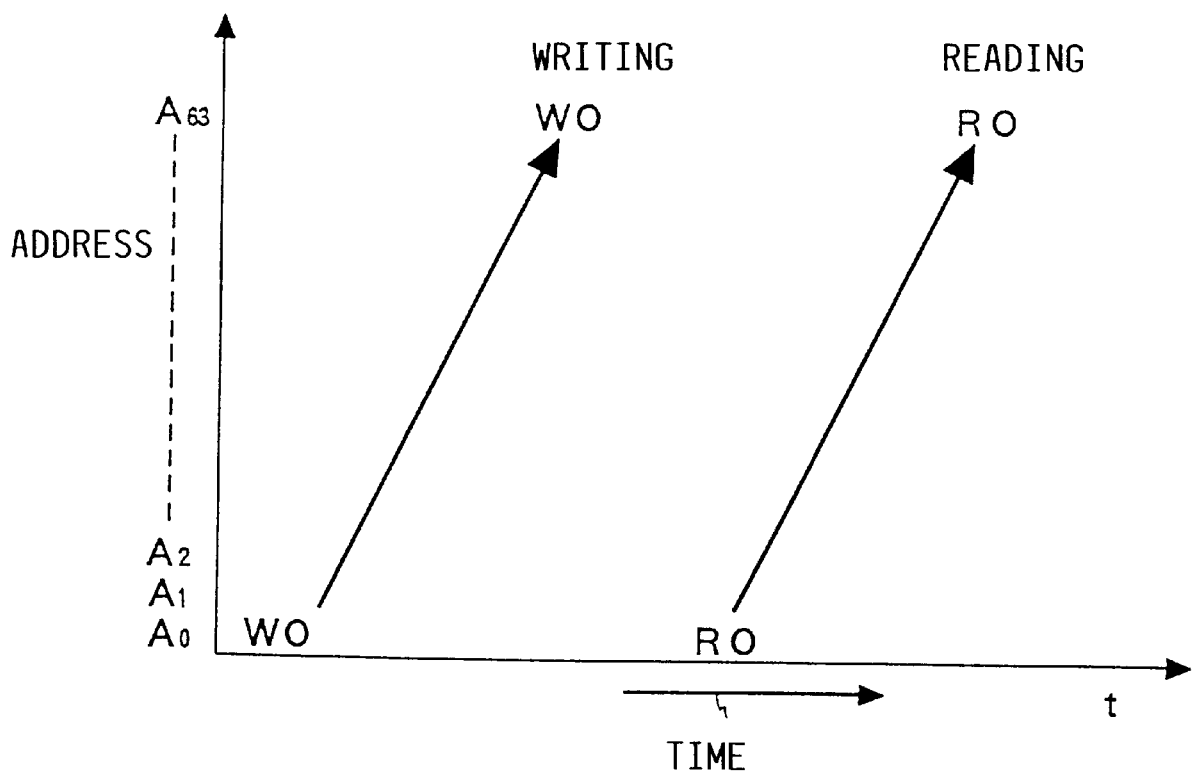
FIG. 8 is a diagram for explaining the operation of the second embodiment of the memory testing apparatus according to the present invention.
Figure 9:
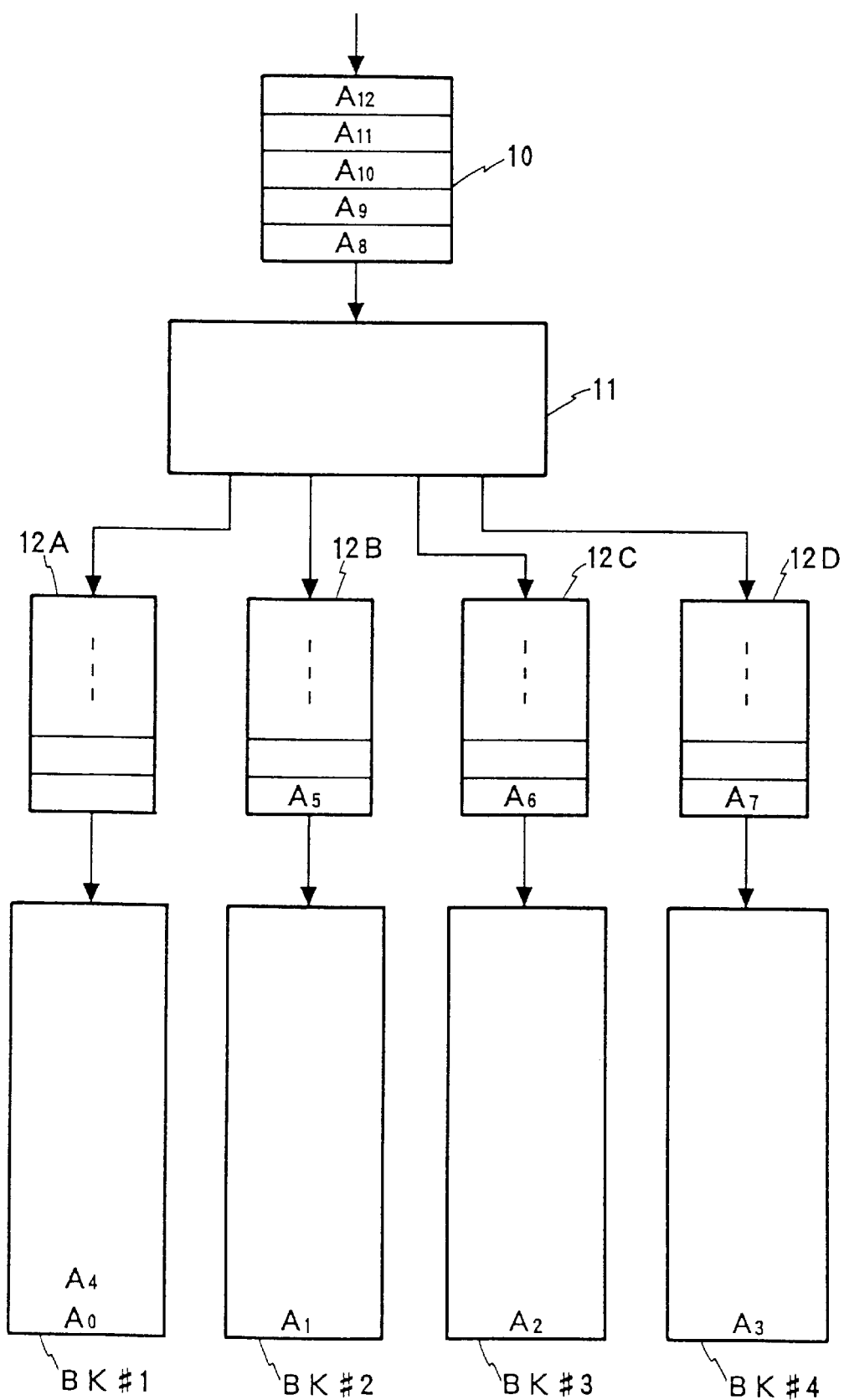
FIG. 9 is a diagram for explaining the operation of the second embodiment of the memory testing apparatus according to the present invention.

When logical 0s are written (WO) in addresses A0–A63 by shifting the address by +1 every time to scan in X direction as shown in FIG. 7 as a test pattern and when the written 0s are sequentially read out (RO) from the addresses A0–A63 as shown in FIG. 8, if failures occur in all the addresses, addresses A0, A1, A2 and A3 are written first in the memory banks BK#1–BK#4 respectively, and then writing is performed in the order of A4, A5, A6 and A7. In this case, addresses are supplied to, for example, the buffer memory 12A in the order of A0, A4, A8, . . . Therefore, the acquiring period is ¼ of reading rate of a memory under test. Address signals and failure data pass through each of the buffer memories 12A–12D without being stored therein and are written in each of the memory banks BK#1–BK#4. Therefore, if only this test pattern is performed, the buffer memories 12A–12D are not necessarily required.

Figure 10:
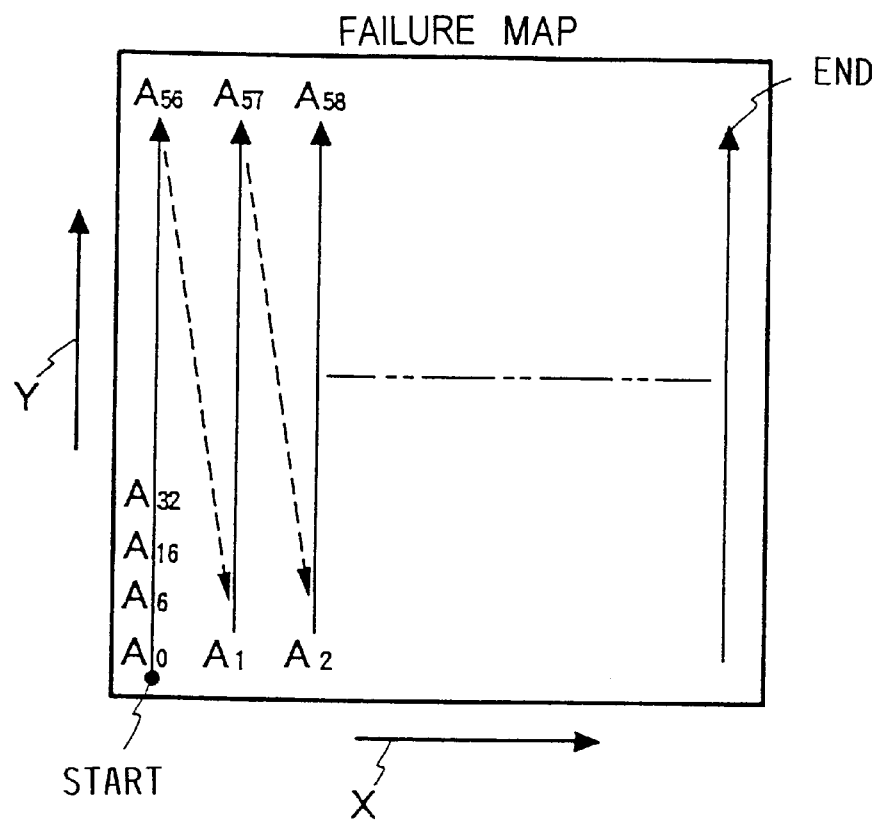
FIG. 10 is a diagram for explaining an example of a test pattern for testing an IC memory.

On the other hand, there is a case in which 0s are written in and read out from an MUT using a test pattern shown in FIG. 10. In this test pattern, since addresses are accessed in the order of A0, A8, A16, A32, A40, . . . A54, if, in this case, failures occur in all the addresses, the failure data must concentratedly be written in the memory block BK#1.

Therefore, if, for example, an eight stage first-in first-out memory is used as the buffer memory 12A so that eight failure data and eight addresses from addresses A0–A56 can be held, the eight failure data and eight address signals are stored in the buffer memory 12A and the next reading after accessing up to A56 is performed on addresses A1–A57. As a result, since these failure data and address signals of addresses A1–A57 are data to be written in the memory bank BK#2, if the buffer memory 12B has a buffer capacity of eight stages, the data to be written in the memory bank BK#2 can be stored in the buffer memory 12B and then can be written in the memory bank BK#2. When data to be written in the memory banks BK#1 and BK#2 are generated at the next time, writing of the data stored in the buffer memories 12A and 12B into the memory banks BK#1 and BK#2 respectively has already been completed during the time up to then and the buffer memories 12A and 12B are in the empty status. Thus, by providing in each of the buffer memories 12A–12D the stages of the number corresponding to the number of cells in Y direction of MUT addresses, the data acquisition with respect to the test pattern shown in FIG. 10 can be performed.

Figure 6:
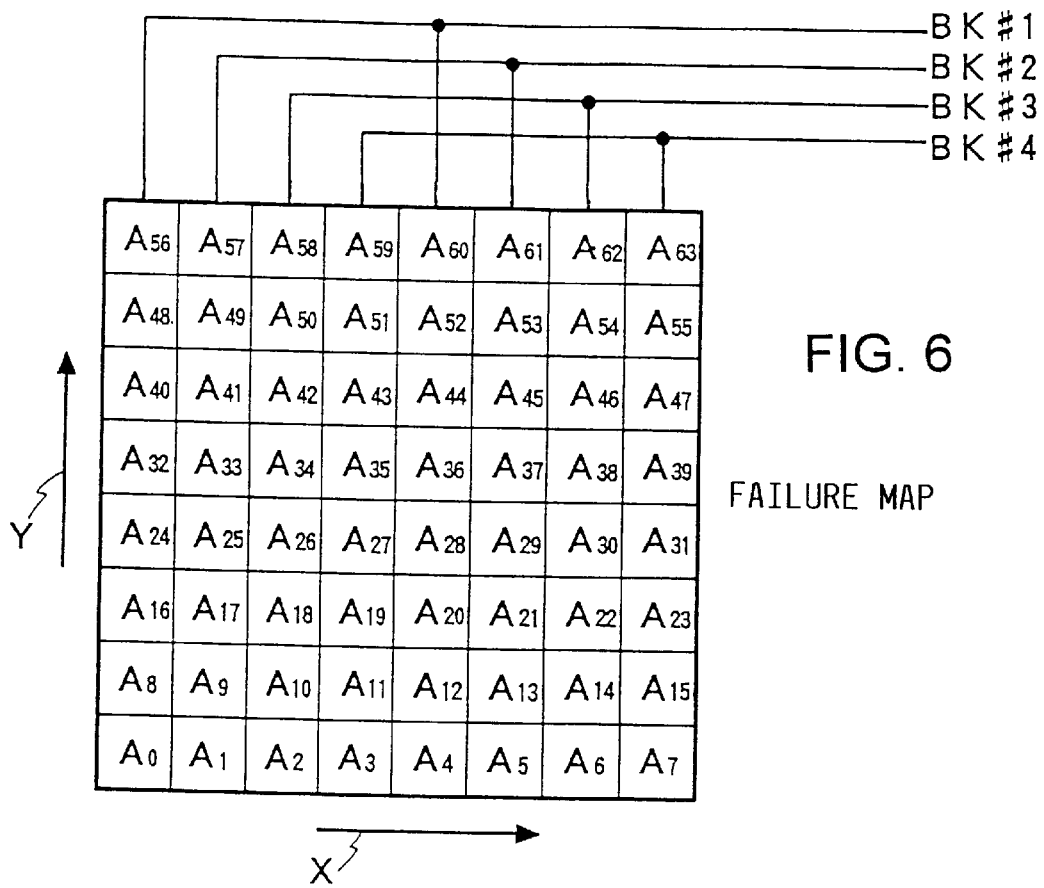
FIG. 6 is a diagram for explaining the operation of the second embodiment of the memory testing apparatus according to the present invention.
Figure 11:
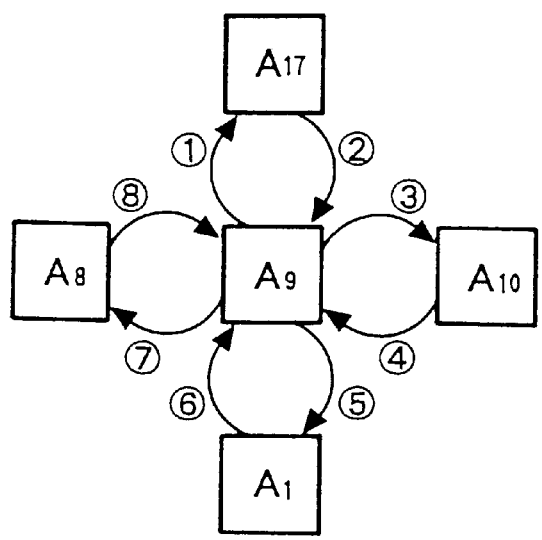
FIG. 11 is a diagram for explaining an example of an inter-cell interference test pattern used in testing an IC memory.
Figure 13:
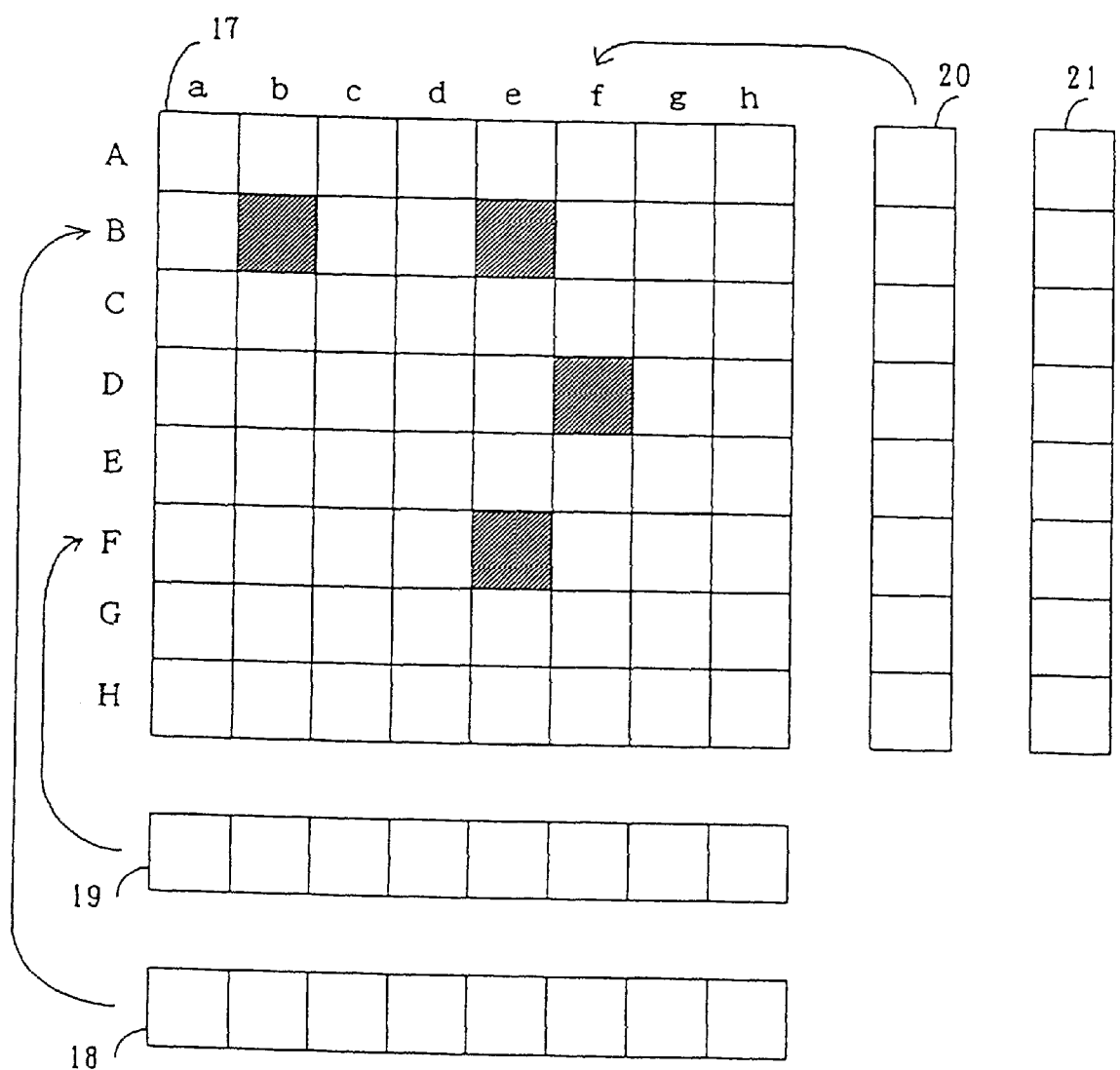
FIG. 13 is an illustration for explaining an example of a failure relieving method in which an internal structure of an IC memory provided with substitute elements is illustrated.
Figure 14:
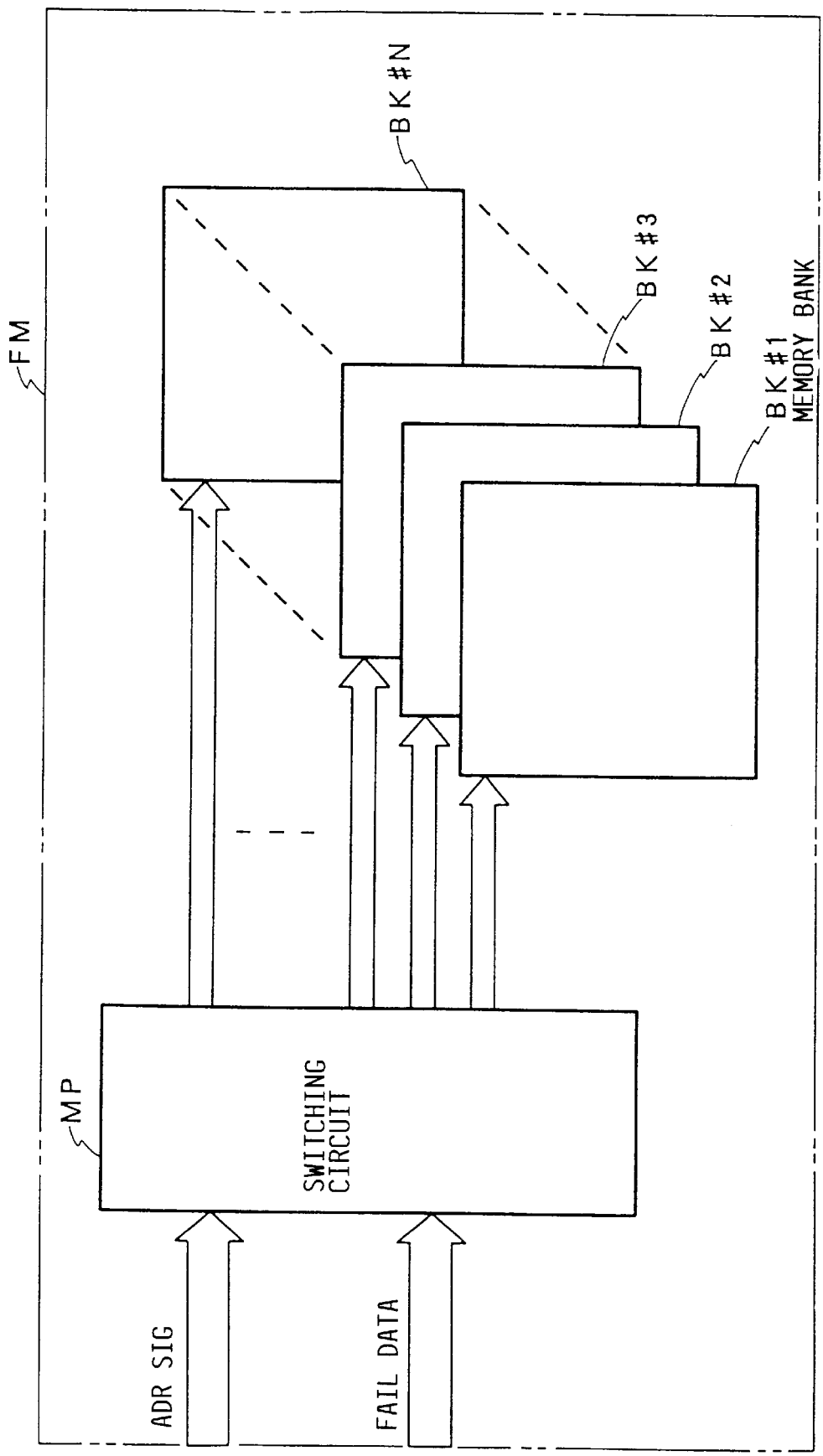
FIG. 14 is a block diagram showing a specific example of a failure analysis memory in which a DRAM is used.

In the arrangement of the memory cell (failure map) shown in FIG. 6, there is a test pattern in which, for example, an address A9 is defined as an address of interest as shown in FIG. 11, and test cycles are defined, for example, as follows with the interested address A9 centered in the testing.

| Test Cycle | (1), | (2), | (3), | (4), | (5), | (6), (7), | (8), | (9), |
|---|---|---|---|---|---|---|---|---|
| Write/Read | W1, | R1, | W0, | R1, | W0, | R1, W0, | R1, | W0, |
| Address | A9, | A9, | A10, | A9, | A8, | A9, A1, | A9, | A17, |
| Test Cycle | (10) | . . . | | | | | | |
| Write/Read | R1 | . . . | | | | | | |
| Address | A9 | . . . | | | | | | |

This test pattern is a test pattern in which a logical 1 is written in address A9 in test cycle (1), a logical 1 is read out from address A9 in test cycle (2), a logical 0 is written in address A10 in test cycle (3) and a logical 1 is read out from address A9 in test cycle (4) . . . In these 10 test cycles, the interested address A9 is accessed six times. Five out of the six accesses are reading operations. At each of the reading operations, a logical comparison is performed and a check is made to see if a failure has occurred.

Here, if there is a failure cell in the interested address A9, a failure occurs in each of the test cycles (2), (4), (6), (8) and (10). When the failure occurrence address A9 is repeatedly and consecutively inputted to the pipeline register 10, only the failure data and the address signal generated in the test cycle (1) are left in the pipeline and the failure data and the address signals generated in the other test cycles (4), (6), (8) and (10) are not acquired in the pipeline.

Therefore, when failures consecutively occur in a same address, the number of failures is compressed by the pipeline 10. As a result, a high rate data acquisition is not required for the data acquisition into the memory banks BK#1–BK#4.

Further, although a case in which failures consecutively occur in a same address has been explained above, it is also considered that a failure or failures occur(s) in the other address(es) between the failures in the same address. When the number of stages of the pipeline register 10 is four as shown in FIG. 5, if failures occur in, for example, A10, A8, A1 and A17 after the interested address A9, the failure data of the interested address A9 is already outputted from the last stage register 10B4 of the pipeline and is excluded from the subject of address comparison. Therefore, when a failure occurs in the interested address A9 at the next time, the interested address A9 is acquired again in the pipeline register 10. Even if the interested address A9 is acquired again in the pipeline 10, since the failure data of at least four other addresses exist between the formerly acquired interested address A9 and the latter interested address A9, those data of the former A9 and the latter A9 are not consecutively written in the same memory block.

As is described above, according to the first aspect of the present invention, while the information amount to be read into the computing part 15 for a relief process is the information amount corresponding to the total number of elements of an MUT regardless of the good/failure of each element in the case where a conventional failure analysis memory is used, only the information amount corresponding to the number of failure elements may be read into the computing part 15 in the case where a failure cell array according to the present invention is used, and thus a significant reduction of information amount can be achieved. Also, the time for reading the failure map data created for determination of relief/non-relief into the computing part can be reduced and a test throughput can be improved. Therefore, there is a significant effect that the testing cost of an MUT can be reduced.

In addition, according to the second aspect of the present invention, since the memory blocks BK#1–BK#N in which data are to be written are prescribed by the least significant bit or bits of a failure occurrence address, an address for accessing each of the memory blocks BK#1–BK#N is limited to a certain range in advance. Therefore, when the number of interleaves is N, the volume of memory elements used in each of the memory blocks BK#1–BK#N can be limited to 1/N. Therefore, the usage volume of memory elements can significantly be reduced.

Further, according to the third aspect of the present invention, even if failures consecutively occur in a same address, the acquisition of the failures after the first one is inhibited by the pipeline register 10. Therefore, an occurrence of a situation in which failures in a same address are consecutively written in a same memory bank (a situation in which a high rate writing is required) can be avoided. Thus, since a memory element especially operating in high rate may not be used, a significant effect that a failure analysis memory can be built easily and inexpensively is obtained.

Further, in the above embodiments, the switching of the switching circuit 11 is controlled by a value of the least significant two bits of a failure occurrence address. However, the number of bits may be three bits or four bits and is not limited to two bits. The point is that the number of bits is determined in accordance with the number of memory banks.

I claim:

1. A memory testing apparatus for testing an IC memory having a plurality of unit elements to be tested, said memory testing apparatus comprising;

a pattern generator outputting a test pattern signal and an expected value pattern signal, the test pattern signal output from said pattern generator being applied to an IC memory under test;

a logical comparator comparing a response output signal from said memory under test and the expected value pattern signal output from said pattern generator to detect whether there is an anti-coincidence between both signals and generating a failure signal as a result of the comparison when the anti-coincidence occurs between both of said signals;

a failure cell array comprising a plurality of failure cells connected in cascade, each of said failure cells storing a failure signal indicative of a failure unit element at which the anti-coincidence occurs together with an address signal of the failure unit element, respectively; and an arithmetic part to which said failure signals and address signals indicating the respective failure unit elements of said memory under test are supplied from the failure cell array.

2. The memory testing apparatus according to claim 1 wherein mask means for inhibiting a portion of said address signal is provided between said pattern generator and said failure cell array.

3. A memory testing apparatus comprising a pattern generator for outputting a test pattern signal and an expected value pattern signal, a logical comparator, and a failure analysis memory, and being arranged such that a test pattern signal outputted from said pattern generator is applied to a memory under test, a response output signal from said memory under test and an expected value pattern signal outputted from said pattern generator are supplied to said logical comparator wherein said response output signal is compared with said expected value pattern signal to detect whether there is an anti-coincidence between both signals or not, and as a result of the comparison, when an anti-coincidence occurs between both said signals, a failure signal outputted from said logical comparator is written in said failure analysis memory at an address thereof which is the same address as that of said memory under test at which said anti-coincidence has occurred on the basis of an address signal supplied to said memory under test and said failure analysis memory from said pattern generator, said failure signal indicating the memory cell of said memory under test in which said anti-coincidence has occurred, said memory testing apparatus being characterized by:

a switching circuit provided at input side of said failure analysis memory and having switch positions controlled in accordance with a value of the least significant bit or bits of an address signal which indicates an address of said memory under test at which an anti-coincidence has occurred, the number of said least significant bits being arbitrary selected, a plurality of memory banks each storing said failure signal which is switched by said switching circuit and is outputted therefrom at the same address of each memory bank as the address of said memory under test at which an anti-coincidence has occurred, and a pipeline register inserted in each of signal paths of the failure signal and the address signal to be supplied to said plurality of memory banks and for limiting the passing of failure signals and address signals generated at the same address in close test cycles to only one failure signal and one address signal.

4. The memory testing apparatus according to claim 3 wherein a buffer memory constructed by a first-in first-out memory is inserted between said switching circuit and each of said memory banks.

5. The memory testing apparatus according to claim 3 wherein said pipeline register is positioned at the previous stage side of said switching circuit.

6. The memory testing apparatus according to claim 3 wherein said pipeline register is put in each of a plurality of branch paths formed at the subsequent stage side of said switching circuit.

7. The memory testing apparatus according to claim 3 wherein said pipeline register is arranged such that a plurality of registers are connected in cascade to construct a pipeline, and further comprises a plurality of address comparators for comparing an address signal stored in each stage of the pipeline with an address at which an anti-coincidence has newly occurred, and a gate controlled to take a closed state when a coincidence signal is outputted from among said address comparators, thereby to prevent a newly generated failure signal and an address signal from being taken in said pipeline.

8. A memory testing apparatus for testing an IC memory having a plurality of unit elements to be tested comprising;

a pattern generator outputting a test pattern signal and an expected value pattern signal, the test pattern signal output from said pattern generator being applied to an IC memory under test;

a logical comparator comparing a response output signal from said memory under test and the expected value pattern signal outputted from said pattern generator to detect whether or not there is an anti-coincidence between both signals and for generating a failure signal as a result of the comparison when the anti-coincidence occurs between both said signals;

a failure cell array comprising a plurality of failure cells connected in cascade, each of said failure cells storing a failure signal indicative of a failure unit element at which the anti-coincidence occurs together with an address signal of the failure unit element, respectively; and an arithmetic part to which said failure signals and address signals indicating the respective failure unit elements of said memory under test are supplied from the failure cell array wherein:

said failure cell array comprises:

an address hold register, an address transfer register, an address comparator, a status transfer register, and a controller;

said address hold register receiving said address signal, an output signal from said controller, and a reset signal, and sends its output signal to said address comparator, said address transfer register receives said address signal and said reset signal, and sends said address signal for use in a next stage, said address comparator receives said address signal and an output signal from said address hold register, and sends a coincidence signal to said controller, said status transfer register receives an output signal from said controller and said reset signal, and sends said failure signal for use in next stage, and said controller receives said failure signal, an output signal from said address comparator and an output signal from said status hold register, and sends a signal to said address hold register, to said status hold register and to said status transfer register, respectively.

* * * * *